(12) United States Patent
Ohmi et al.

(10) Patent No.: US 8,342,734 B2
(45) Date of Patent: Jan. 1, 2013

(54) VEHICULAR LIGHT SOURCE UNIT

(75) Inventors: Takeshi Ohmi, Shizuoka (JP); Shinya Enomoto, Kanagawa (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 480 days.

(21) Appl. No.: 12/704,340

(22) Filed: Feb. 11, 2010

(65) Prior Publication Data

US 2010/0214799 A1 Aug. 26, 2010

(30) Foreign Application Priority Data

Feb. 23, 2009 (JP) ................................. 2009-039511

(51) Int. Cl.
*H01R 33/00* (2006.01)

(52) U.S. Cl. ................... 362/657; 362/249.02; 362/294; 362/373; 362/545; 362/548; 362/656; 362/658; 257/99; 445/23

(58) Field of Classification Search .................... 257/99; 445/23; 362/218, 249.02, 294, 373, 545, 362/548, 547, 652, 655–659, 800
See application file for complete search history.

(56) References Cited

U.S. PATENT DOCUMENTS

| 7,344,296 B2* | 3/2008 | Matsui et al. ................. 362/652 |
| 7,549,786 B2* | 6/2009 | Higley et al. ................. 362/646 |
| 8,016,469 B2* | 9/2011 | Takeda et al. ................. 362/543 |

FOREIGN PATENT DOCUMENTS

| JP | 03-040770 H | 4/1991 |
| JP | 2001-006813 A | 1/2001 |
| JP | 2004-146411 A | 5/2004 |
| JP | 2004-172032 A | 6/2004 |
| JP | 2005-209812 A | 8/2005 |

OTHER PUBLICATIONS

English abstract of JP2004172032 published on Jun. 17, 2004, espacenet database, 1 page.
Notification of Reasons for Refusal issued in Japanese Application No. 2009-039511, dated Oct. 17, 2012, and translation thereof (6 pages).

* cited by examiner

*Primary Examiner* — Stephen F Husar
(74) *Attorney, Agent, or Firm* — Osha Liang LLP

(57) ABSTRACT

A vehicular light source unit includes: an LED element integrated with a pair of plate-like feeding terminals; and an LED socket including a pair of plate spring-like conductive terminals in which movable portions and supporting portions that are integrally formed by a conductive member hold the pair of feeding terminals from both sides, and a resin housing integrated with the pair of conductive terminals. The LED element is detachably supported by the plate spring-like conductive terminals through the feeding terminals and receives a power supply from both sides of the feeding terminals.

18 Claims, 5 Drawing Sheets

VEHICULAR LIGHT SOURCE UNIT

BACKGROUND OF INVENTION

1. Field of the Invention

The present invention relates to a vehicular light source unit using an LED element mounted on a circuit board as a light source.

2. Related Art

In vehicular marker lamps and the like that have an LED as a light source, a plurality of LEDs are generally mounted on a metal substrate by soldering or caulking. However, heating the LED generally reduces a luminous flux thereof. Therefore, soldering to the substrate heats the LED and adversely affects the luminous flux of the LED. Mounting by soldering and caulking also requires dedicated equipment that increases the cost of mounting. In addition, current LEDs have weak luminous flux per lamp, so the plurality of LEDs must be quickly mounted by soldering and the like. If the luminous flux of the LED can be improved, then only one LED need be adopted as the light source. Therefore, a low-cost mounting method for attaching an LED to a substrate without soldering equipment or a caulker would be useful.

Patent Document 1 (Japanese Patent Application Laid-Open (Kokai) No. JP-A-2004-172032) below discloses a structure in which an LED is mounted on a molding substrate. In the molding substrate described in Patent Document 1, a current-flowing portion formed of a conductive resin material is integrated on an upper surface of an insulating portion formed of an insulating resin agent. The insulating portion of the molding substrate is integrally formed with a pair of right and left latch pieces. The pair of right and left latch pieces projects upward from the current-flowing portion and has a projecting portion facing downward. Meanwhile, the LED described in Patent Document 1 is provided with a pair of right and left band plate-like connector terminals on both sides of a main body portion that has a light emission portion. The connector terminal is provided with a hole for engaging with the projecting portion.

The pair of right and left connector terminals of the LED is inserted into a space between the conductive current-flowing portion and the insulating latch portion of the molding substrate. In addition, the projection of the latch portion is engaged with the hole of the connector terminal. Accordingly, the LED is fixed to the molding substrate.

[Patent Document 1] Japanese Patent Application Laid-Open (Kokai) No. JP-A-2004-172032

SUMMARY OF INVENTION

The mounting structure described in Patent Document 1 does not have a problem with heating of the LED due to soldering because the LED is not directly soldered on the substrate, or a problem with high costs due to the use of dedicated equipment. However, according to the mounting structure described in Patent Document 1, the connector terminal of the LED is inserted into the space between the current-flowing portion formed of a conductive material and the latch portion formed of an insulating material. This means that power from the molding substrate to the connector terminal is supplied from only one side surface contacting the conductive portion. Therefore, in the mounting structure described in Patent Document 1, the contact between the connector terminal and the current-flowing portion is not likely to be enough for mounting, which may result in no power being supplied from the molding substrate to the LED and, thus, cause a lighting failure.

One or more embodiments of the present invention provide a vehicular light source unit having a structure that mounts an LED to a circuit board such that power is reliably supplied from the circuit board to the LED, in addition to preventing heating of an LED element and reducing the cost of mounting the LED element to the circuit board.

In one or more embodiments, a vehicular light source unit includes an LED element integrated with a pair of plate-like feeding terminals, and an LED socket including a pair of plate spring-like conductive terminals in which movable portions and supporting portions that are integrally formed by a conductive member hold the pair of feeding terminals from both sides, and a resin housing integrated with the pair of conductive terminals. The LED element is detachably supported by the plate spring-like conductive terminals through the feeding terminals and receives a power supply from both sides of the feeding terminals.

The LED element is mounted on the LED socket by a plate spring and is mounted on a circuit board through the LED socket. Therefore, the LED element can be mounted on the circuit board without soldering and caulking using dedicated equipment.

In addition, the LED element is supported by the LED socket so that both sides of the plate-like feeding terminals are held by the plate spring-like conductive terminals formed of a conductive member. Therefore, the conductive terminals adequately contact the feeding terminals.

According to one or more embodiments, in the vehicular light source unit described above, the feeding terminals include holes. The supporting portions of the conductive terminals include projections engaged with the holes when the feeding terminals are mounted, and stoppers that contact end portions of the feeding terminals when the feeding terminals are mounted.

When the feeding terminals of the LED element are mounted on the plate spring-like conductive terminals, the projections of the conductive terminals are engaged with the holes of the feeding terminals, and the ends of the feeding terminals come in contact with the stoppers of the supporting portions. Accordingly, the LED element is positioned between the movable portions and the supporting portions of the conductive terminals. When the holes of the LED element are engaged with the projections, the ends of the feeding terminals come in contact with the stoppers of the supporting portions. Therefore, the holes do not pass over the projections and are reliably engaged with the projections.

According to one or more embodiments, in the vehicular light source unit described above, the supporting portions of the conductive terminals include vertical walls that guide the positions of both sides of the feeding terminals in outer end portions.

When the LED element is mounted on the plate spring-like conductive terminals, both end portions of the feeding terminals come in contact with the vertical walls. Accordingly, the LED element is fixed to the circuit board and also positioned in the width direction.

According to one or more embodiments, in the vehicular light source unit described above, the supporting portions of the conductive terminals are formed longer than the movable portions.

The LED element can be mounted by mounting the feeding terminals on the supporting portions of the conductive terminals that are formed longer than the movable portions, and sliding the feeding terminals toward the movable portions.

According to one or more embodiments, in the vehicular light source unit described above, the LED element includes a heat radiating terminal. The resin housing includes a metal heat radiating member. The heat radiating terminal is thermally connected with the heat radiating member so as to allow heat transfer.

Heat generated from the LED is transferred from the heat radiating terminal to the metal heat radiating member and released outside. Therefore, even if an LED with high luminous flux is used for a light source, the heat does not become trapped in the LED during lighting.

In the vehicular light source unit of one or more embodiments, because the LED is not soldered, the LED is not heated during mounting. In addition, there is no cost increase due to dedicated equipment being required. Furthermore, the feeding terminals of the LED element are held by the movable portions and the supporting portions of the conductive terminals that are integrally formed by the conductive member, and reliably receive a power supply. Therefore, lighting failures do not occur.

According to the vehicular light source unit of one or more embodiments, when the LED element is mounted on the conductive terminals, the holes on the LED element side are engaged with the projections on the conductive terminal side, and the position of the LED element in the longitudinal direction is determined by the stoppers on the conductive element side. Therefore, the LED element can be mounted on the LED socket with high precision and is easily detachable.

According to the vehicular light source unit of one or more embodiments, when the LED element is mounted on the conductive terminals, the position of the LED element in the width direction is determined by the vertical walls. Therefore, the LED element can be mounted on the LED socket with even higher precision and is easily detachable.

According to the vehicular light source unit of or more embodiments, the LED element can be more easily mounted on the LED socket.

According to the vehicular light source unit of one or more embodiments, heating of the LED while lit is reduced, thus preventing a reduction in the luminous flux of the LED.

Other aspects and advantages of the invention will be apparent from the following description, the drawings and the claims.

DETAILED DESCRIPTION

Embodiments of the present invention will be described below with reference to the figures.

Figure 1:
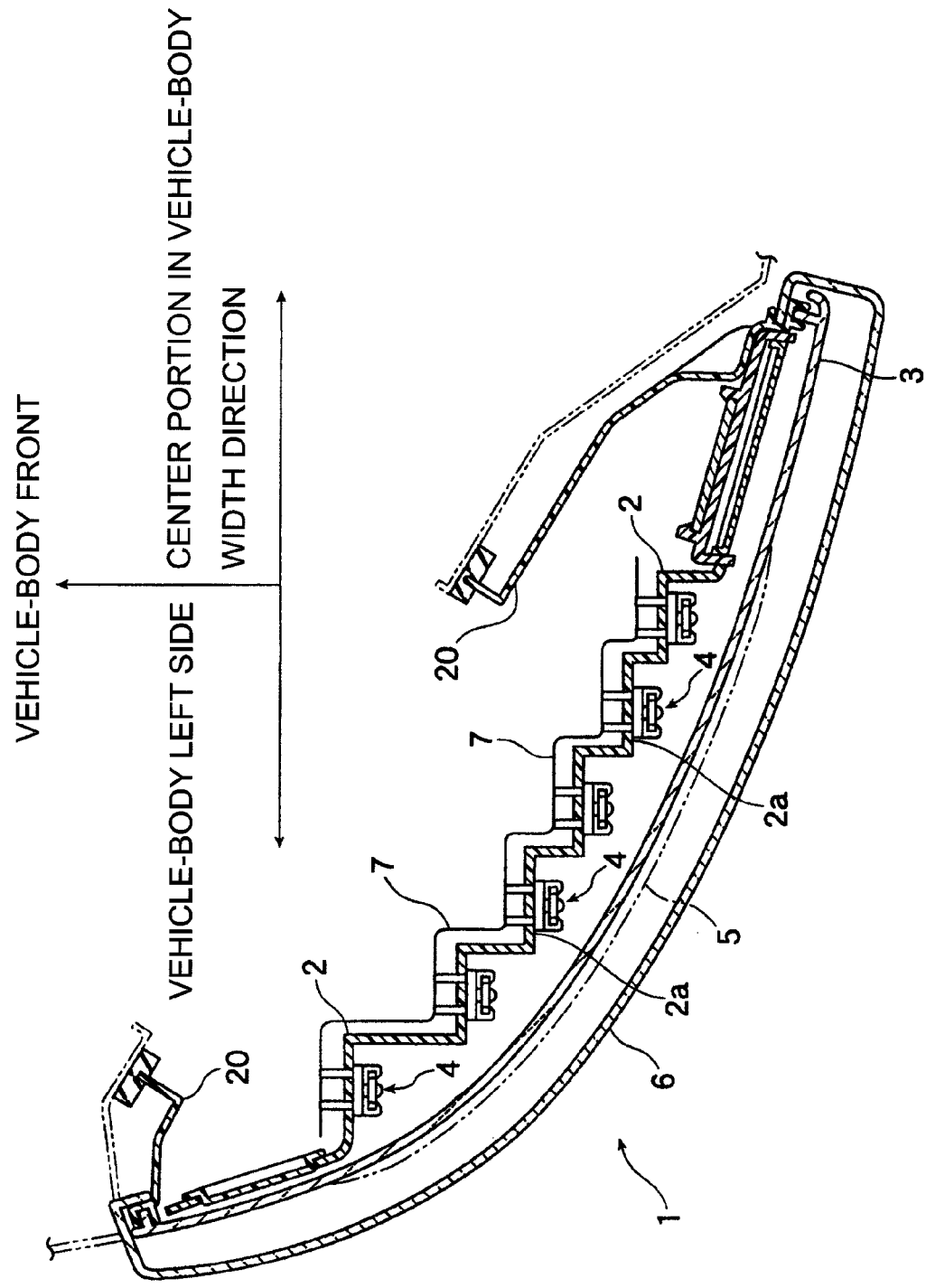
FIG. 1 is a horizontal cross-sectional view of a vehicular light source unit according to a first embodiment of the present invention.
Figure 2:
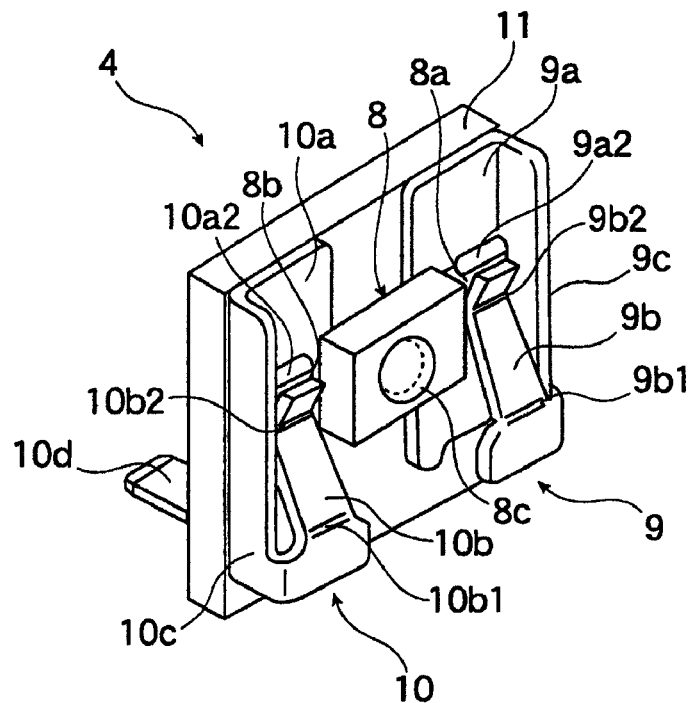
FIG. 2 is a perspective view of an LED socket of the vehicular light source unit according to the first embodiment.
Figure 3:
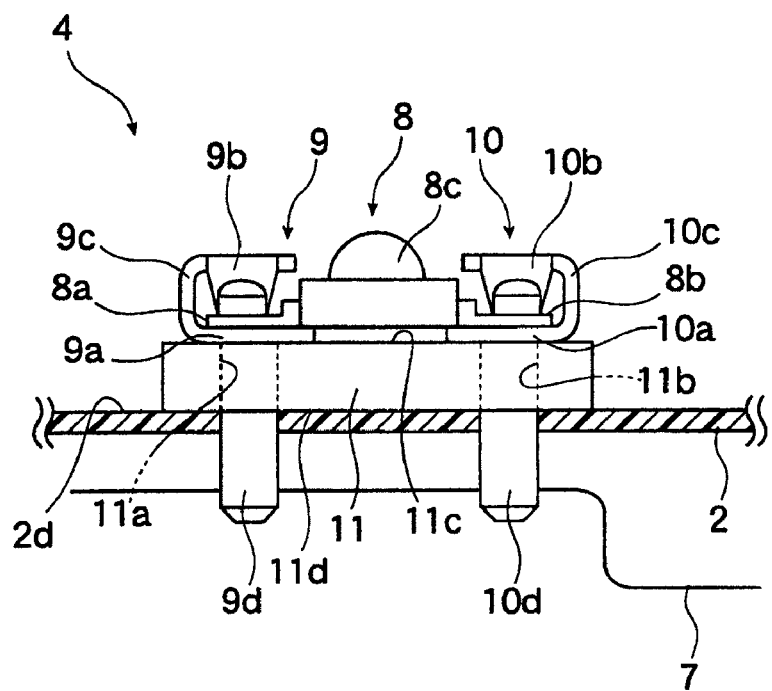
FIG. 3 is a frontal view of the LED socket.
Figure 4:
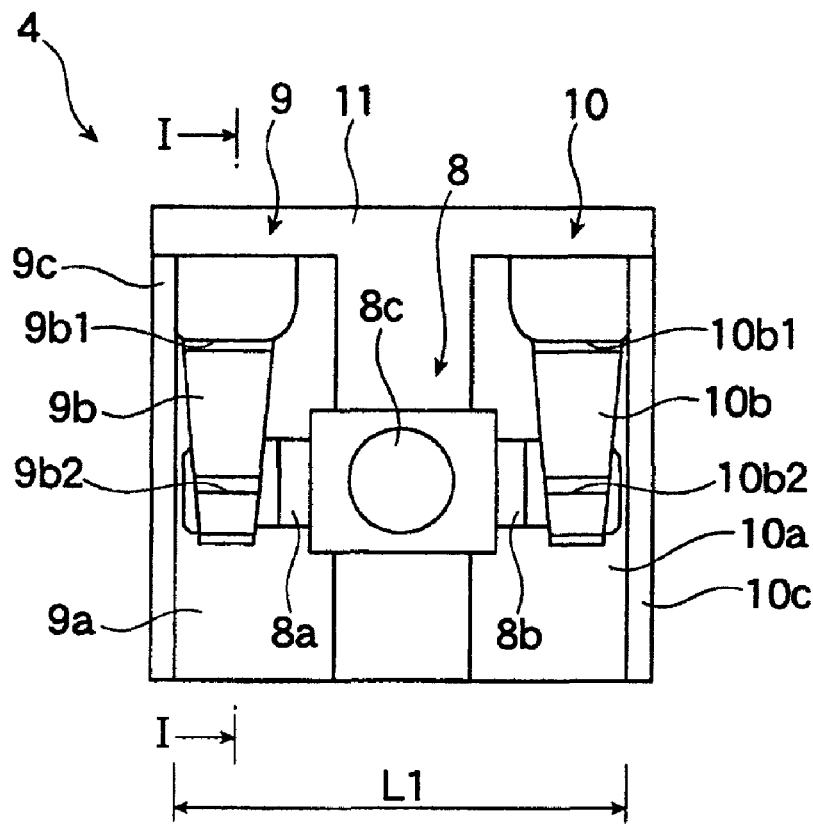
FIG. 4 is a plane view of the LED socket.
Figure 5:
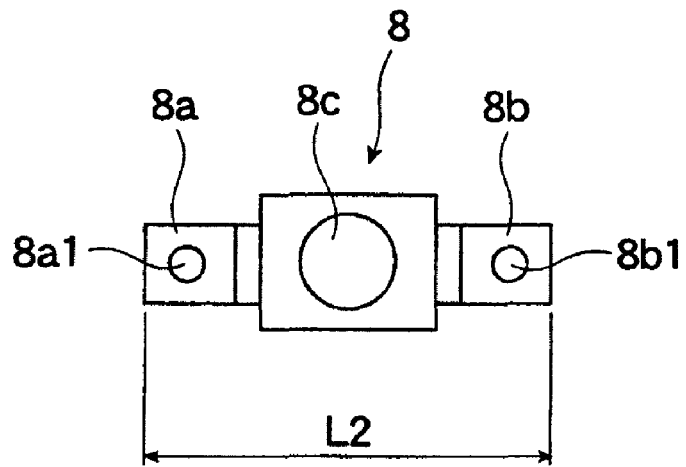
FIG. 5 is a plane view of an LED element.
Figure 6:
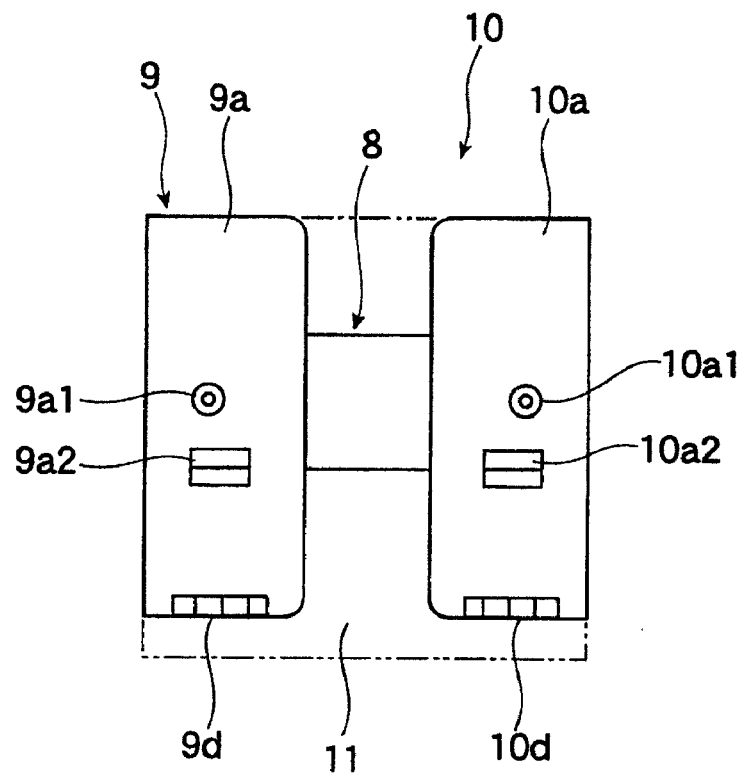
FIG. 6 is a bottom view of the LED socket.
Figure 7:
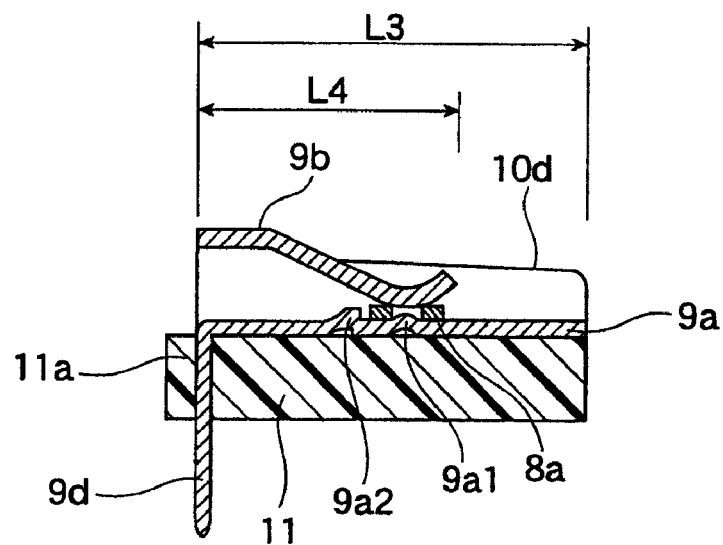
FIG. 7 is a cross-sectional view taken along a line I-I in FIG. 4.
Figure 8:
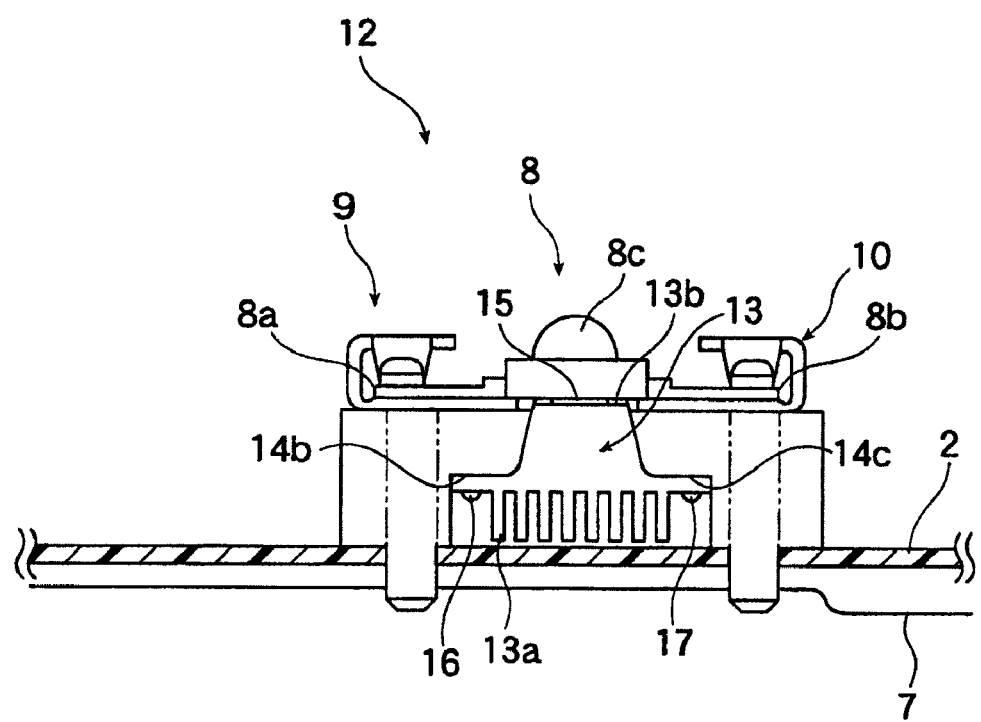
FIG. 8 is a frontal view that shows an LED socket of a vehicular light source unit according to a second embodiment.

FIGS. 1 to 8 show embodiments of the present invention. FIG. 1 is a horizontal cross-sectional view of a vehicular light source unit according to the first embodiment of the present invention. FIG. 2 is a perspective view of an LED socket of the vehicular light source unit according to the first embodiment. FIG. 3 is a frontal view of the LED socket. FIG. 4 is a plane view of the LED socket. FIG. 5 is a plane view of an LED element. FIG. 6 is a bottom view of the LED socket. FIG. 7 is a cross-sectional view taken along a line I-I in FIG. 4. FIG. 8 is a frontal view that shows an LED socket according to the second embodiment.

The first embodiment of the present invention will be described with reference to FIGS. 1 to 7. As shown in FIG. 1, a vehicular light source unit 1 is structured from a stepped circuit board 2 fixed to a lamp body 20, a front cover 3 provided opposite a front surface 2a of the board 2, a plurality of LED sockets 4 attached to the plane 2a of the board as light sources, an outer lens 6 that externally shields the front cover 3 provided in front of the LED sockets 4 and a lens step 5 formed in front of the front cover 3. The LED sockets 4 are connected to a power source (not shown) and receive a power supply through a conductive cable 7.

As shown in FIGS. 2 and 3, the LED socket 4 is structured from an LED element 8, a pair of plate spring-like conductive terminals (9, 10) on which the LED element 8 is detachably mounted, and a resin housing 11 that is integrated with the pair of plate spring-like conductive terminals (9, 10) and mounted on the circuit board 2.

The LED element 8 includes feeding terminals (8a, 8b) on both sides of an element body 8c. The pair of plate spring-like conductive terminals (9, 10) includes supporting portions (9a, 10a) and movable portions (9b, 10b) that sandwich the feeding terminals (8a, 8b) of the LED element 8, vertical walls (9c, 10c) that determine the positions of both end portions of the feeding terminals (8a, 8b), and feeding portions (9d, 10d) connected with the conductive cable 7.

The pair of plate spring-like conductive terminals (9, 10) according to the first embodiment is integrally formed with components by bending conductive members such as a metal plate. The pair of plate spring-like conductive terminals (9, 10) are symmetrically formed when viewed from the front in FIG. 3. The vertical walls (9c, 10c) are curved at general right angles from outer end portions of the supporting portions (9a, 10a). The tab-like feeding portions (9d, 10d) curve at general right angles in a direction opposite the vertical walls from the supporting portions (9a, 10a). The tab-like movable portions (9b, 10b) and the vertical walls (9c, 10c) are parallel and connected with each other through base end portions thereof. Connection portions between the movable portions (9b, 10b) and the vertical walls are generally curved at right angles toward the supporting portions (9a, 10a). The movable portions (9b, 10b) are provided with first curved portions (9b1, 10b1) that curve in the vicinity of the base end portions toward the supporting portions (9a, 10a) and second curved portions (9b2, 10b2) that curve in the vicinity of edge portions in a direction opposite the first curved portions (9b1, 10b1).

The second curved portions (9b2, 10b2) are provided opposite the supporting portions (9a, 10a) while maintaining a thinner space than a plate pressure of the feeding terminals (8a, 8b) of the LED element 8 or provided in contact with the supporting portions (9a, 10a). The movable portions (9b, 10b) form a blade spring together with the supporting portions (9a, 10a) through the vertical walls (9c, 10c). The blade spring holds the feeding terminals (8a, 8b) that are inserted between the second curved portions (9b2, 10b2) and the supporting portions (9a, 10a). The feeding terminals (8a, 8b) receive a sufficient power supply from both sides through the supporting portions (8a, 8b) and the second curved portions (9b2, 10b2) of the movable portions.

As shown in FIGS. 3 and 7, the LED socket 4 is formed by passing the feeding portions (9d, 10d) of the plate spring-like conductive terminals (9, 10) through attachment holes (11a, 11b) of the resin housing 11 to integrate the plate spring-like conductive terminals (9, 10) with the housing 11. The plate spring-like conductive terminals (9, 10) are fixed by press-fitting the feeding portions (9d, 10d) into the attachment holes (11a, 11b), the inner shape of which is slightly smaller than an outer shape of the feeding portions (9d, 10d), by adhering back surfaces of the supporting portions (9a, 10a) to a front surface 11c of the housing 11 as shown in FIG. 5, or the like.

As shown in FIGS. 5 and 6, the feeding terminals (8a, 8b) of the LED element 8 are provided with holes (8a1, 8b1) for determining the position of the LED element 8 when mounted on the plate spring-like conductive terminals (9, 10). In addition, the supporting portions (9a, 10a) of the plate-spring like conductive terminals (9, 10) are provided with projections (9a1, 10a1) that are engaged with the holes (8a1, 8b1) by press working or the like.

Furthermore, the supporting portions (9a, 10a) are provided with stoppers (9a2, 10a2) that are located in front of the feeding terminals (8a, 8b) when the holes (8a1, 8b1) are engaged with the projections (9a1, 10a1) by press working or the like. If the holes (8a1, 8b1) of the feeding terminals (8a, 8b) pass over the projections (9a1, 10a1), the ends of the feeding terminals (8a, 8b) hit the stoppers (9a2, 10a2). Therefore, the holes are reliably engaged with the projections (9a1, 10a1).

As shown in FIGS. 4 and 5, the plate spring-like conductive terminals (9, 10) are integrated with the housing 11 so that a distance L1 between inner walls of the vertical walls (9c, 10c) is generally the same as a width L2 of the LED element 8. The positions in the width direction of the LED element 8 and the conductive terminals (9, 10) are reliably determined by the inner walls of the vertical walls (9c, 10c) that guide both ends of the feeding terminals (8a, 8b).

As shown in FIG. 7, a length L3 of the supporting portions (9a, 10a) is formed longer than a length L4 of the movable portions (9b, 10b). The feeding terminals (8a, 8b) are mounted on an end side of the supporting portions (9a, 10a), that is, in the vicinity of the lower end in FIG. 4, and are then slid upward toward the movable portions (9b, 10b) on the base end portion side. Accordingly, the LED element 8 is easily mounted on the conductive terminals (9, 10).

Mounting of the LED element 8 with respect to the LED socket 4 is performed as described below. First, the LED element 8 is provided on the end side of the supporting portions (9a, 10a) so that both ends of the feeding terminals (8a, 8b) are aligned to the inner walls of the vertical walls (9c, 10c) of the plate spring-like conductive terminals (9, 10). Next, the feeding terminals (8a, 8b) are slid along the supporting portions (9a, 10a) and the vertical walls (9c, 10c) toward the base end portion side and thus sandwiched between the second curved portions (9b2, 10b2) of the movable portions (9b, 10b) and the supporting portions (9a, 10a). The LED element 8 is fixed to the plate spring-like conductive terminals (9, 10) by engagement between the holes (8a1, 8b1) of the feeding elements and the projections (9a1, 10a1) of the supporting portions. Meanwhile, if the LED element 8 is slid over the engagement position of the holes (8a1, 8b1) and the projections (9a1, 10a1), the ends of the feeding terminals (8a, 8b) come in contact with the stoppers (9a2, 10a2) of the supporting portions such that the LED element cannot slide any further. Therefore, the holes (8a1, 8b1) are reliably engaged with and fixed to the projections (9a1, 10a1).

The LED socket 4 is mounted on the circuit board 2 by adhering or threadedly fixing a back surface 11d of the housing 11 on a front surface 2d of the circuit board 2 as shown in FIG. 3. The feeding portions (9d, 10d) pass through the circuit board 2 and are connected with the conductive cable 7 by soldering or the like. Note that the LED element 8 can be detached from the LED socket 4 when the feeding portions (9d, 10d) and the conductive cable 7 are soldered. Therefore, the LED element 8 is not heated during connection of the conductive cable. The LED socket 4 mounted on the circuit board 2 is easily detachable using a structure in which the circuit board 2 is provided with a terminal that receives the LED socket 4 and the LED socket 4 is mounted on the terminal.

Next, an LED socket according to a second embodiment will be described with reference to FIG. 8. In an LED socket 12 as shown in FIG. 8, a heat radiating member 13 is integrated with a resin housing 14, and a heat radiating terminal 15 that projects from the element body 8c of the LED element 8 is connected with the heat radiating member 13. The LED socket 12 otherwise has a structure common to that of the LED socket 4 according to the first embodiment.

The heat radiating member 13 is formed of metal with a higher thermal conductivity than that of the resin housing 14, and the like. A plurality of radiating fins 13a projects toward the circuit board 2. The resin housing 14 is provided with a stepped hole 14a that passes through the front and back of the resin housing 14. The heat radiating member 13 is fixed to stepped portions (14b, 14c) of the stepped hole 14a by screws (16, 17). Note that the heat radiating member 13 may be fixed to the stepped portions (14b, 14c) by adhesion and the like in addition to screwing. The plurality of heat radiating fins 13a is in a state of non-contact with the circuit board 2 when the housing 14 is fixed to the circuit board 2.

An upper end 13b of the heat radiating member 13 attached to the housing 14 projects upward from the stepped hole 14a running therethrough. The heat radiating terminal 15 projects from a back surface of the LED element 8 and is thermally connected with the upper end 13b of the heat radiating member 13 so as to allow heat transfer. Note that the feeding terminals (8a, 8b) may serve as the heat radiating terminal 15 with the use of a non-short-circuiting structure.

According to the LED socket 12 of the second embodiment, most of the heat generated from the LED element 8 is transferred to the heat radiating member 13 and released from the plurality of heat radiating fins 13 to the atmosphere. Therefore, the LED element 8 is not overheated.

While description has been made in connection with exemplary embodiments of the present invention, it will be obvious to those skilled in the art that various changes and modification may be made therein without departing from the present invention. It is aimed, therefore, to cover in the appended claims all such changes and modifications falling within the true spirit and scope of the present invention.

DESCRIPTION OF THE REFERENCE NUMERALS

1 VEHICULAR LIGHT SOURCE UNIT
4 LED SOCKET
8 LED ELEMENT
8a, 8b PAIR OF FEEDING ELEMENTS
8a1, 8b2 HOLE
9, 10 PLATE SPRING-LIKE CONDUCTIVE TERMINAL
9a, 10a SUPPORTING PORTION
9a1, 10a1 PROJECTION
9a2, 10a2 STOPPER
9b, 10b MOVABLE PORTION
9c, 10c VERTICAL WALL
11, 14 RESIN HOUSING
13 HEAT RADIATING MEMBER
15 HEAT RADIATING TERMINAL
L3 LENGTH OF SUPPORTING PORTION
L4 LENGTH OF MOVABLE PORTION

What is claimed is:

1. A vehicular light source unit comprising:
an LED element integrated with a pair of plate-like feeding terminals; and
an LED socket comprising:
   a pair of plate spring-like conductive terminals in which movable portions and supporting portions that are integrally formed by a conductive member hold the pair of feeding terminals from both sides; and
   a resin housing integrated with the pair of conductive terminals,
wherein the LED element is detachably supported by the plate spring-like conductive terminals through the feeding terminals and receives a power supply from both sides of the feeding terminals.

2. The vehicular light source unit according to claim 1,
wherein the feeding terminal comprises a hole, and
wherein the supporting portion of the conductive terminal comprising:
   a projection engaged with the hole when the feeding terminal is mounted, and
   a stopper that contacts an end portion of the feeding terminal when the feeding terminal is mounted.

3. The vehicular light source unit according to claim 1,
wherein the supporting portion of the conductive terminal comprises a vertical wall that guides both sides of the feeding terminal at an outer end portion.

4. The vehicular light source unit according to claim 1,
wherein the supporting portion of the conductive terminal is formed longer than the movable portion.

5. The vehicular light source unit according to claim 1,
wherein the LED element comprises a heat radiating terminal,
wherein the resin housing comprises a metal heat radiating member, and
wherein the heat radiating terminal is thermally connected with the heat radiating member.

6. The vehicular light source unit according to claim 2,
wherein the supporting portion of the conductive terminal comprises a vertical wall that guides both sides of the feeding terminal at an outer end portion.

7. The vehicular light source unit according to claim 2,
wherein the supporting portion of the conductive terminal is formed longer than the movable portion.

8. The vehicular light source unit according to claim 3,
wherein the supporting portion of the conductive terminal is formed longer than the movable portion.

9. The vehicular light source unit according to claim 2,
wherein the LED element comprises a heat radiating terminal,
wherein the resin housing comprises a metal heat radiating member, and
wherein the heat radiating terminal is thermally connected with the heat radiating member.

10. The vehicular light source unit according to claim 3,
wherein the LED element comprises a heat radiating terminal,
wherein the resin housing comprises a metal heat radiating member, and
wherein the heat radiating terminal is thermally connected with the heat radiating member.

11. The vehicular light source unit according to claim 4,
wherein the LED element comprises a heat radiating terminal,
wherein the resin housing comprises a metal heat radiating member, and
wherein the heat radiating terminal is thermally connected with the heat radiating member.

12. The vehicular light source unit according to claim 1, further comprising:
a stepped circuit board;
a plurality of LED sockets; and
a plurality of LED elements,
wherein the plurality of LED sockets are mounted respectively on steps of the stepped circuit board, and
wherein the plurality of LED elements are respectively detachably supported by the plurality of LED sockets.

13. A method of manufacturing a vehicular light source unit comprising:
providing an LED element integrated with a pair of plate-like feeding terminals;
providing an LED socket comprising:
   a pair of plate spring-like conductive terminals in which movable portions and supporting portions that are integrally formed by a conductive member hold the pair of feeding terminals from both sides; and
   a resin housing integrated with the pair of conductive terminals, and
mounting the LED element on the LED socket such that the LED element is detachably supported by the plate spring-like conductive terminals through the feeding terminals and receives a power supply from both sides of the feeding terminals.

14. The method of manufacturing a vehicular light source unit according to claim 13,
wherein the feeding terminal comprises a hole, and
wherein the supporting portion of the conductive terminal comprises:
   a projection engaged with the hole when the feeding terminal is mounted, and
   a stopper that contacts an end portion of the feeding terminal when the feeding terminal is mounted.

15. The method of manufacturing a vehicular light source unit according to claim 13,
wherein the supporting portion of the conductive terminal comprises a vertical wall that guides both sides of the feeding terminal at an outer end portion.

16. The method of manufacturing a vehicular light source unit according to claim 13,
wherein the supporting portion of the conductive terminal is formed longer than the movable portion.

17. The method of manufacturing a vehicular light source unit according to claim 13,
wherein the LED element comprises a heat radiating terminal,
wherein the resin housing comprises a metal heat radiating member,
wherein the heat radiating terminal is thermally connected with the heat radiating member.

18. The vehicular light source unit according to claim 13, further comprising:
providing a stepped circuit board;
providing a plurality of LED sockets;
providing a plurality of LED elements;
mounting the plurality of LED sockets respectively on steps of the stepped circuit board, and
mounting the plurality of LED elements respectively on the plurality of LED sockets.

* * * * *